United States Patent
Ryu et al.

(10) Patent No.: US 9,018,028 B2
(45) Date of Patent: Apr. 28, 2015

(54) MAGNETIC SENSOR AND METHOD OF MANUFACTURE THEREOF

(71) Applicant: MagnaChip Semiconductor, Ltd., Cheongju-si (KR)

(72) Inventors: Seung Han Ryu, Cheongju-si (KR); Jong Yeul Jeong, Cheongju-si (KR); Kwan Soo Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/963,174

(22) Filed: Aug. 9, 2013

(65) Prior Publication Data

US 2014/0367813 A1    Dec. 18, 2014

(30) Foreign Application Priority Data

Jun. 12, 2013   (KR) .................. 10-2013-0066892

(51) Int. Cl.
| | | |
|---|---|---|
| H01L 21/00 | (2006.01) | |
| H01L 29/82 | (2006.01) | |
| H01L 43/04 | (2006.01) | |
| G01R 33/07 | (2006.01) | |
| H01L 27/22 | (2006.01) | |
| H01L 43/14 | (2006.01) | |

(52) U.S. Cl.
CPC .............. *H01L 43/04* (2013.01); *G01R 33/072* (2013.01); *H01L 27/22* (2013.01); *H01L 43/14* (2013.01)

(58) Field of Classification Search
USPC ........... 257/421–427; 324/251, 207.2; 438/48
See application file for complete search history.

(56) References Cited

U.S. PATENT DOCUMENTS

| | | | | |
|---|---|---|---|---|
| 4,908,685 | A | * | 3/1990 | Shibasaki et al. ............. 257/425 |
| 6,545,462 | B2 | | 4/2003 | Schott et al. |
| 8,169,215 | B2 | * | 5/2012 | Kataoka et al. ............... 324/251 |

\* cited by examiner

*Primary Examiner* — Calvin Lee
(74) *Attorney, Agent, or Firm* — NSIP Law

(57) ABSTRACT

A magnetic sensor and a manufacturing method thereof are provided. The magnetic sensor includes: a substrate comprising a plurality of Hall elements, a protective layer formed on the substrate, a base layer formed on the protective layer, and an integrated magnetic concentrator (IMC) formed on the base layer and comprising a surface with an elevated portion. The base layer has a larger cross-sectional area than the IMC.

21 Claims, 17 Drawing Sheets

US 9,018,028 B2

MAGNETIC SENSOR AND METHOD OF MANUFACTURE THEREOF

CROSS-REFERENCE TO RELATED APPLICATIONS

This application claims the benefit under 35 U.S.C. §119 (a) of Korean Patent Application No. 10-2013-0066892, filed on Jun. 12, 2013, in the Korean Intellectual Property Office, the entire disclosure of which is incorporated herein by reference for all purposes.

BACKGROUND

1. Field

The following description relates to a magnetic sensor and a manufacturing method thereof, and to a semiconductor-based magnetic sensor for digital compass or electronic compass, a semiconductor-based magnetic sensor having Hall elements and integrated magnetic concentrators, and a manufacturing method thereof.

2. Description of Related Art

A semiconductor-based magnetic sensor detects a magnetic signal using a semiconductor device. A semiconductor-based magnetic sensor may include a combination of a plurality of Hall elements and an integrated magnetic concentrator (IMC) that performs magnetic amplification functions.

One type of magnetic sensor is a solid-state magnetic sensor that uses a semiconductor device, a Hall element, a semiconductor magnetoresistance element, and a ferromagnetic magnetoresistance element.

Magnetic sensors are used in digital compasses and electronic compasses. Geomagnetic sensors sense terrestrial magnetism and provide direction information, and are capable of being used in mobile phones, two-way radios, GPS, PDA, or navigation equipments. Digital compass is a digitized version of a magnetic compass. A magnetic compass is designed to inform its user of directions such as north, south, east and west by detecting the magnetism of the earth, and is used to determine the path of travel of ships, airplanes, and the like. A digital compass can perform the same function, and can be mounted on a portable digital device such as a smart phone. With the use of mobile applications, a digital compass can inform the user of directions such as north, south, east, and west, like a magnetic compass. Further, a digital compass that is installed on a mobile device may be used with a map application installed on the mobile device for the purpose of utilizing the direction information.

Digital compass is one type of magnetic sensors that may be manufactured using semiconductor manufacturing processes. In one type of such a compass, a plurality of Hall elements is formed on a semiconductor substrate, and integrated magnetic concentrators are formed thereon to amplify the terrestrial magnetism. The term 'digital compass' as used herein encompasses electronic compass, digital compass and geomagnetic sensor.

An example of an integrated magnetic concentrator (IMC) is a flat-shaped magnetic field concentrator made of a magnetic material. A magnetic sensor can be constructed with a flat-shaped magnetic field concentrator and a plurality of Hall elements arranged in a vicinity of the magnetic field concentrator to detect the direction of a three-dimensional magnetic field. In such a magnetic sensor, Hall effect occurs in the presence of a magnetic field. With the application of a predetermined voltage to the semiconductor substrate, electrons or holes move, and the direction of the electrons or holes change due to the amplified magnetic field. As a result, the path of travel is lengthened. Accordingly, resistance increases, and the Hall elements are used to detect the same. Generally, a plurality of Hall elements is arranged in the magnetic sensor to monitor the changes in resistance or the amount of electric currents.

A magnetic sensor with the above-described constitution may be capable of detecting a horizontal magnetic field with the magnetic field concentrators and may also be capable of amplifying an electric field in a region in which the Hall elements are disposed.

FIG. 1 illustrates a plan view of a magnetic sensor disclosed in U.S. Pat. No. 6,545,462, which includes a flat shaped magnetic field concentrator 3.

The above constitution has a shortcoming of increasing offset voltage due to high stress on the Hall-effect elements 2.1 to 2.6.

Recently, attempts have been made to decrease the offset voltage of magnetic sensors by reducing the stress on the thick magnetic field concentrators. The 'offset voltage' occurs when the Hall elements have voltage other than zero in the absence of the magnetic field.

Higher offset voltage leads into higher possibility of malfunction. High offset voltage causes minute changes in the actual voltage of the Hall elements in the presence of a magnetic field, and thus deteriorates the sensitivity of the magnetic sensor.

By lowering the signal-to-noise value, high offset voltage causes shortcomings such as difficulty of detecting minute changes in a magnetic field. Accordingly, the reduction of the offset voltage and the improvement of sensitivity are desirable.

SUMMARY

In one general aspect, there is provided a magnetic sensor including: a substrate comprising a plurality of Hall elements; a protective layer formed on the substrate; a base layer formed on the protective layer; and an integrated magnetic concentrator (IMC) formed on the base layer and comprising a surface with an elevated portion. The base layer has a larger cross-sectional area than the IMC.

The base layer may include a protruding portion that extends from an outer circumference of the IMC to an edge of the base layer by a predetermined length.

The predetermined length of the protruding portion may be 10 μm or greater and 50 μm or less.

The general aspect of the magnetic sensor may further include a first buffer layer disposed on the protective layer, and a second buffer layer disposed on the first buffer layer, in which the elevated portion of the IMC has a shape that corresponds to the second buffer layer.

The second buffer layer may include polyimide.

The elevated portion of the IMC may include a plurality of concaves and convexes (凹凸) in cross section.

The plurality of Hall elements may overlap with an edge of the IMC in a vertical direction.

The base layer may include a titanium layer or a titanium-tungsten layer, and a copper layer.

In another general aspect, there is provided a digital compass that includes a magnetic sensor described above.

In yet another general aspect, there is provided a method for manufacturing a magnetic sensor, the method including: obtaining a substrate comprising a plurality of Hall elements; forming a protective layer on the substrate; forming a first buffer layer on the protective layer; forming a second buffer layer on the first elevation layer; forming a base layer comprising a surface with an elevated portion corresponding to the second buffer layer; and forming an integrated magnetic concentrator (IMC) comprising a surface with an elevated portion on the base layer. The base layer has a larger area than the IMC.

The forming of the base layer may include forming a protruding portion that extends from an outer circumference of the IMC to an edge of the base layer by a predetermined length, using a photoresist to cover the IMC and performing wet etching.

The predetermined length of the protruding portion may be 10 µm or greater and 50 µm or less.

The elevated portion of the IMC may have a shape corresponding to the second buffer layer.

The second buffer layer may include polyimide.

The elevated portion of the IMC may include a plurality of concaves and convexes (凹凸) in cross section.

The plurality of Hall elements may overlap with an edge of the IMC.

The base layer may include a titanium layer or a titanium-tungsten layer, and a copper layer.

In another general aspect, there is provided a magnetic sensor including: a substrate comprising a plurality of Hall elements; a protective layer formed on the substrate; a base layer formed on the protective layer; and an integrated magnetic concentrator (IMC) formed on the base layer and comprising a surface with an elevated portion, the base layer protruding outward from an edge of the IMC.

The plurality of Hall elements may include an N-type region and a P-type region implanted on the substrate.

The N-type region may be formed deeper than the P-type region.

The plurality of the Hall elements may overlap with an edge of the IMC in a vertical direction.

Other features and aspects may be apparent from the following detailed description, the drawings, and the claims.

Figure 1:
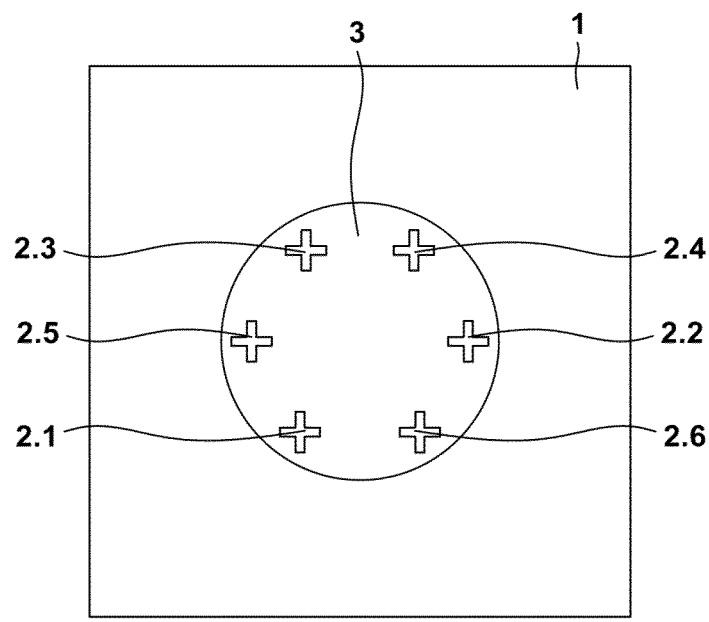
FIG. 1 is a plan view of a magnetic sensor.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 2A:
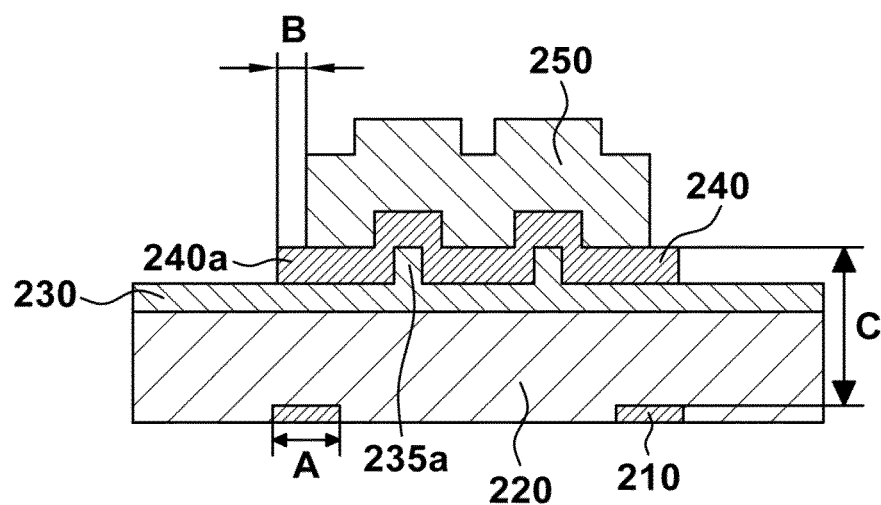
FIG. 2A is a cross-sectional view of an example of a magnetic sensor.

FIG. 2A is a cross-section view of an example of a magnetic sensor that is formed with a semiconductor substrate.

Referring to FIG. 2A, the magnetic sensor 200 includes a substrate 220 having a plurality of Hall elements 210 arranged therein, a protective layer 230 formed on the substrate 220, a base layer 240 formed on the protective layer 230 and an integrated magnetic concentrator (IMC 250) formed on the base layer 240 and having a bent or an elevated portion on a surface thereof. The substrate 220 may be a semiconductor substrate. The base layer 240 is so sized as to have a larger area in a plan view than the IMC 250. That is, the cross-sectional area of the IMC 250 along a plan parallel to the base layer 240 is smaller in size than the area of the protective layer 230 that the base layer 240 covers. Accordingly, the base layer 240 protrudes from an edge of the IMC 250. Referring to FIG. 2A, the base layer 240 has a protruding portion 240a that extends from an edge of the base layer 240 by a predetermined length B outside an outer circumference of the IMC 250 to the edge of the base layer 240.

For example, the predetermined length B of the protruding portion 240a may be 10-50 µm. Since the base layer 240 extends beyond the edges of the IMC 250, the pressure, tensile stress, and/or compressive stress on the Hall elements 210 due to the IMC 250 can be reduced. Thus, the stress is reduced because the base layer 240 extends outward beyond the IMC 250.

The IMC 250 may be made of a magnetic material.

Although not illustrated, the protective layer 230 may include a silicon oxide layer and a nitride layer. The protective layer 230 is configured to prevent ingress of water and to prevent corrosion.

To form a bent surface or a surface with one or more elevated portions on the base layer 240, a first buffer elevation layer 234 is formed on the surface of the protective layer 230 and a plurality of second buffer elevations 235a with a predetermined height are formed thereon.

A predetermined number of second buffer elevations 235a may be formed with a predetermined width and a predetermined height. The predetermined number of second buffer elevations 235a and the predetermined width and height may be selected to minimize stress exerted on the Hall elements 210. In one example, the second buffer elevations 235a may be formed to have a width of 5~30 µm, and a height of 1~10 µm, and the number of the second buffer elevations 235a may be set between one to eight.

The presence of a greater number of second buffer elevations 235a may enable a greater reduction of stress on the Hall elements 210. The material for the second buffer elevations 235a may include a polymer material containing polyimide. The material for the second buffer elevations 235a may be the same as the material used for a pre-buffer elevation layer 235. The second buffer elevations 235a may be formed by etching the pre-buffer elevation layer 235 formed on the first buffer elevation layer 234. Both the second buffer elevations 235a and the pre-buffer elevation layer 235 may be formed of polyimide.

The base layer 240 and the IMC 250 may have a plurality of bent surfaces or elevated portions that corresponds to the configuration of the second buffer elevations 235a.

The elevated portions of the IMC 250 may have a regular pattern or an irregular pattern of a plurality of concaves and convexes (凹凸) in its cross-section.

Further, to increase the sensitivity of the Hall elements 210 to magnetic field, the Hall elements 210 may be aligned in a vertical direction of the magnetic sensor to overlap a predetermined area thereof with the edge of the IMC 250. For example, the centers of the Hall elements 210 may be aligned to overlap with the edge of the IMC 250.

Referring to FIG. 2A, with reference to the edge of the IMC 250, the centers of the Hall elements 210 are within a predetermined range that does not deviate from a width A of the Hall elements 210. The width A of the Hall elements 120 may be 50 μm or less, for example.

The distance C from an upper portion of the Hall elements 210 to a lower portion of the IMC 250 may range between 1 μm and 30 μm, for example.

Further, the IMC 250 may be made from a magnetic material that is formed by electroplating. The magnetic material may be an alloy containing two or more of Ni, Fe, Co, Mo or Mn, and may have 5~20 ppm/° C. of coefficient of thermal expansion. In an example in which NiFe alloy is used as the magnetic material, the alloy composition may contain an iron content of 10 to 30 atomic %. The magnitude of magnetic force depends on the composition of the IMC 250, and the iron content influences coercive force. Accordingly, in this example, the iron content is set to approximately 10 to 30 atomic % of the NiFe alloy to ensure appropriate coercive force value.

The base layer 240 may consist of a resin or a metal, and the elevated portions of the base layer 240 may have a regular pattern or an irregular pattern of a plurality of concaves and convexes 凹凸 in its cross-section, as in the case of the bent surface of the IMC 250. As illustrated in FIG. 2A, the approximate location of the elevated portions on an upper surface of the base layer 240 and on an upper surface of the IMC 250 may correspond to one another, while the angles and the depth of the elevated portions may slightly vary.

The elevated portions of the IMC 250 and the base layer 240 may be formed into a circular shape or a polygonal shape. The elevated portions on the surface of the IMC 250 may have a shape of overlaying circles, concentric circles or polygonal loops. The elevated portions may result from the presence of elevated portions on the surface of the base layer 240 and the protective layer 230.

Because the base layer 240 and the IMC 250 have elevated portions on its surface that has a predetermined configuration, and because the area of the protective layer 230 that the base layer 240 covers is larger than the cross-sectional area of the IMC 250 along a plane parallel to the base layer 240, the stress exerted on the Hall elements 210 is reduced in comparison to a structure that has a flat-shaped IMC with its base layer 240 and the IMC 250 having the same size. Furthermore, the size of offset voltage is reduced, and the sensitivity of the Hall elements 210 is improved. To be specific, because the base layer is larger in its cross-sectional area than the IMC, the base layer can absorb some of the stress exerted on the IMC. Further, the influence on the Hall element can be minimized by reducing the cross-sectional area or length of the base layer. The 'stress' as used herein refers to pressure, tensile stress and/or compressive stress exerted on the Hall element.

Figure 2B:
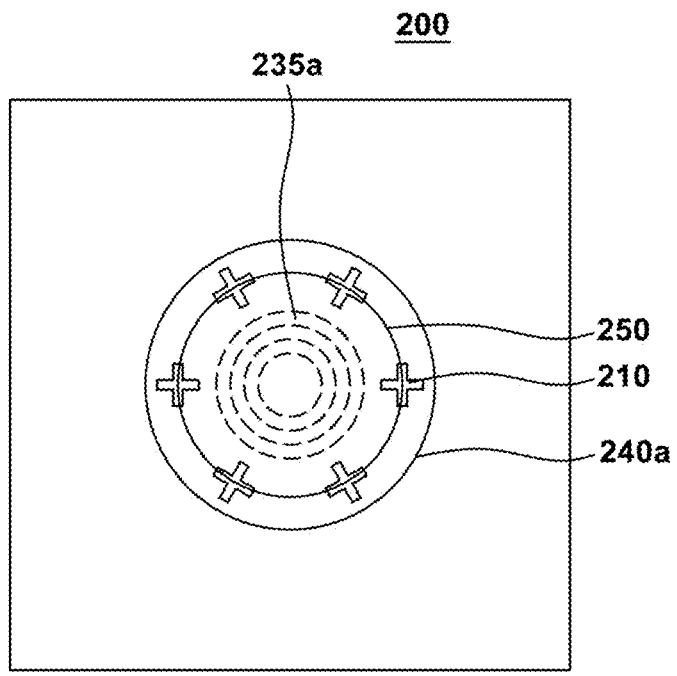
FIGS. 2B and 2C are plan views of additional examples of magnetic sensors.

Referring to FIG. 2B, a plan view of another example of a magnetic sensor 200 is illustrated. In this example, the second buffer elevation layers 235a are formed in the shape of two concentric circles, and the surface of the base layer 240 and the surface of the IMC 250 also have elevated portions in the shape of two concentric circles. However, in other examples, the second buffer elevation layers 235a may have a plan view in which a plurality of polygons are arranged in a loop shape or in which only one circle is formed. The upper surface of an IMC 250 may include elevated portions with a corresponding shape. As used in herein, a corresponding shape includes slight variations of size, slopes and curvature. As illustrated in FIG. 2B, the protruding portion 240a of the base layer 240 extends beyond the edge of the IMC 250.

Referring to FIG. 2B, the hall elements 210 have a shape of a cross, and a center portion of the cross is aligned along an edge of the IMC 250. However, in other examples, the hall elements 210 may have various different shapes, such as a rectangular shape or a polygonal shape. Further, while six hall elements 210 are arranged along an edge of the IMC 250 illustrated in FIG. 2B, in other examples, the number of hall elements 210 may vary. Also, in other examples, the outer edge of the hall elements 210 may be aligned with the outer edge of the base layer 240.

Figure 2C:
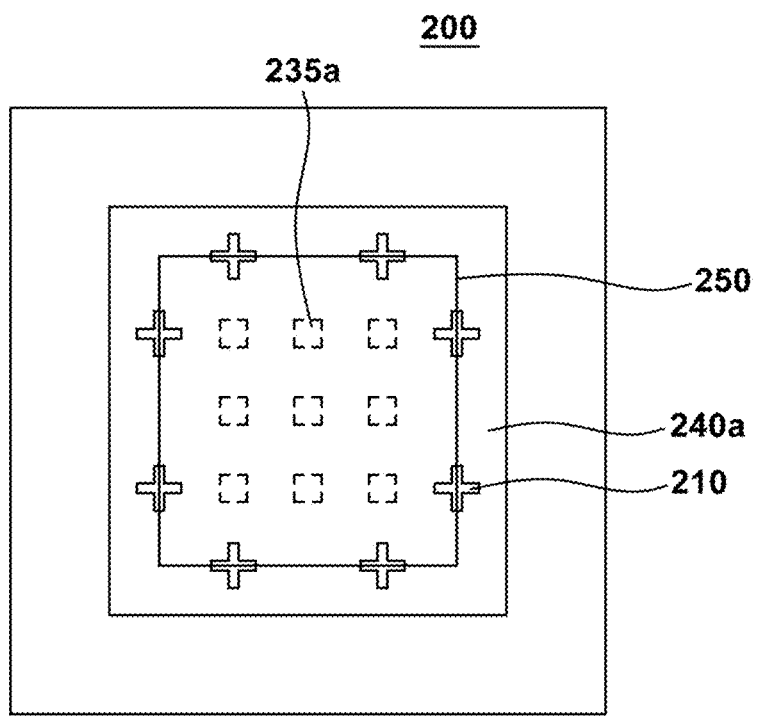

Referring to FIG. 2C, a plan view of another example of a magnetic sensor 200 is illustrated. In this example, the IMC 250 has a rectangular shape. In other examples, the IMC 250 may have other shapes, such as a polygonal shape, an oval shape, or a circular shape. Further, a plurality of IMC 250 may be arranged within a magnetic sensor. In addition, the second buffer elevation layers 235a may be arranged regularly, and may have the shape of a plurality of rectangles. In this example, the upper surface of an IMC 250 includes elevated portions with a corresponding shape, and the protruding portion 240a of the base layer 240 extends beyond the edge of the IMC 250.

It is possible to manufacture a magnetic sensor that uses a Hall-effect device or a Hall sensor through semiconductor manufacturing processes. The magnetic sensor that uses a Hall-effect device or a Hall sensor can be incorporated into a mobile terminal such as a smart phone or a tablet PC. Such a magnetic sensor may function as a digital compass or an electronic compass.

Figure 3A:
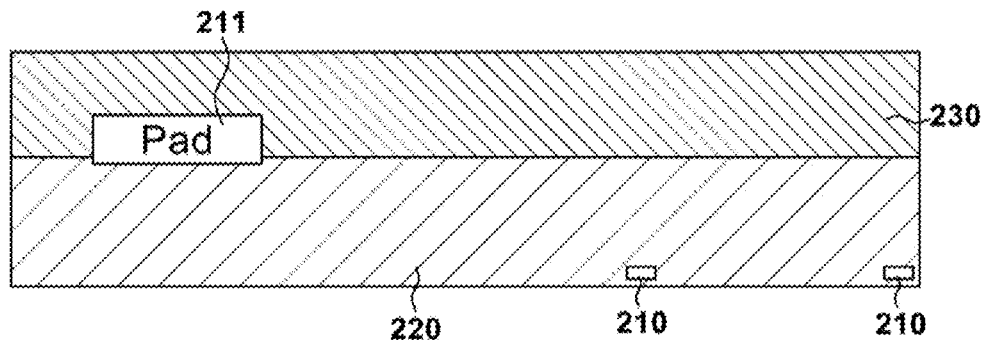
FIGS. 3A to 3P are cross-sectional views illustrating an example of a method of manufacturing a magnetic sensor.
Figure 3B:
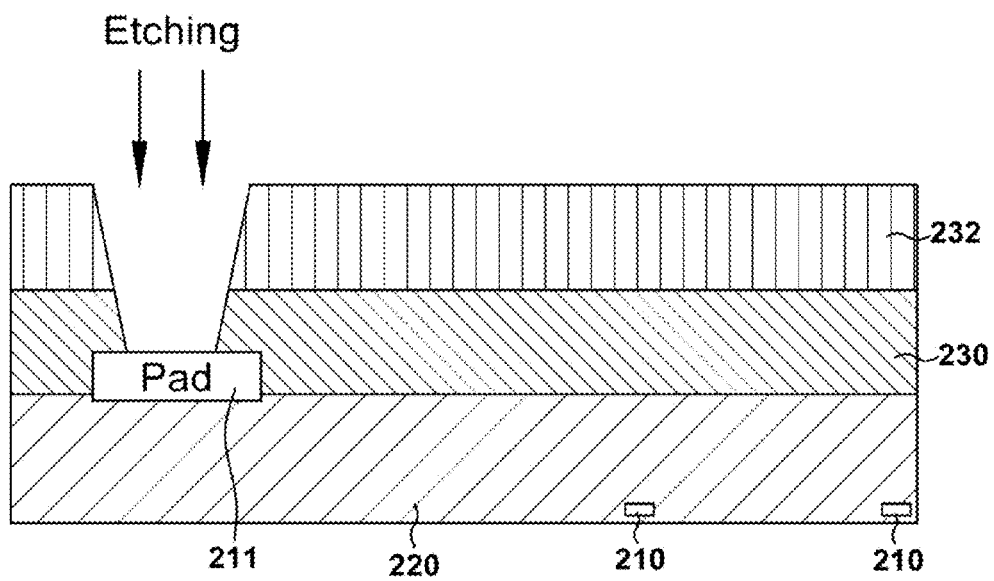
Figure 3C:
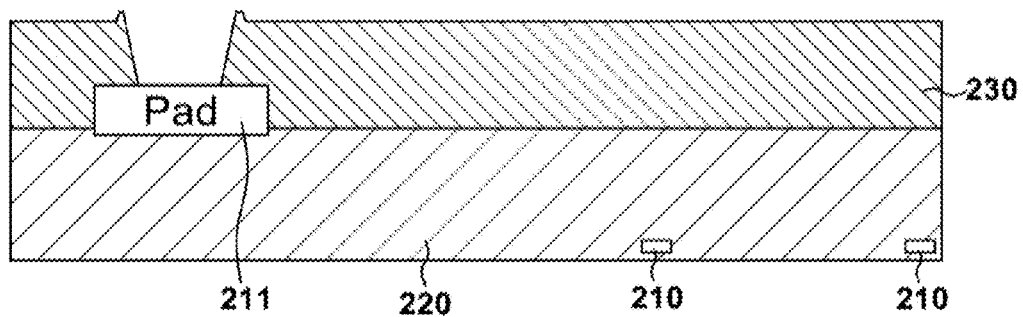
Figure 3D:
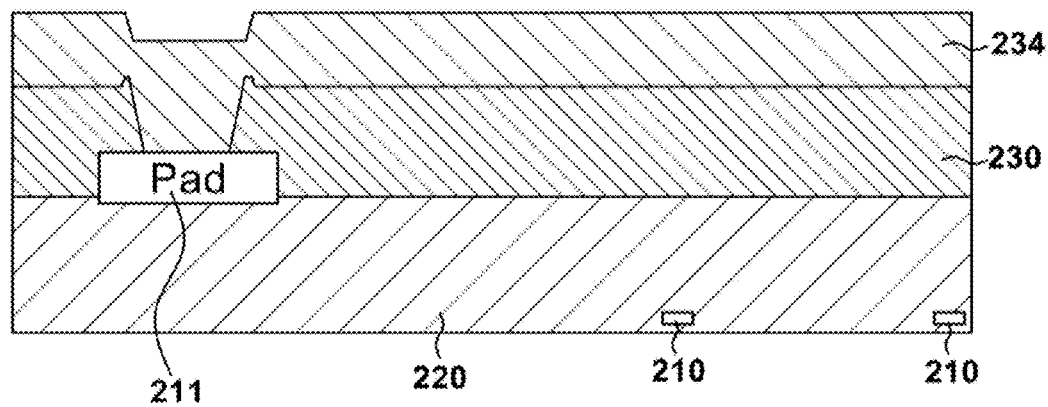
Figure 3E:
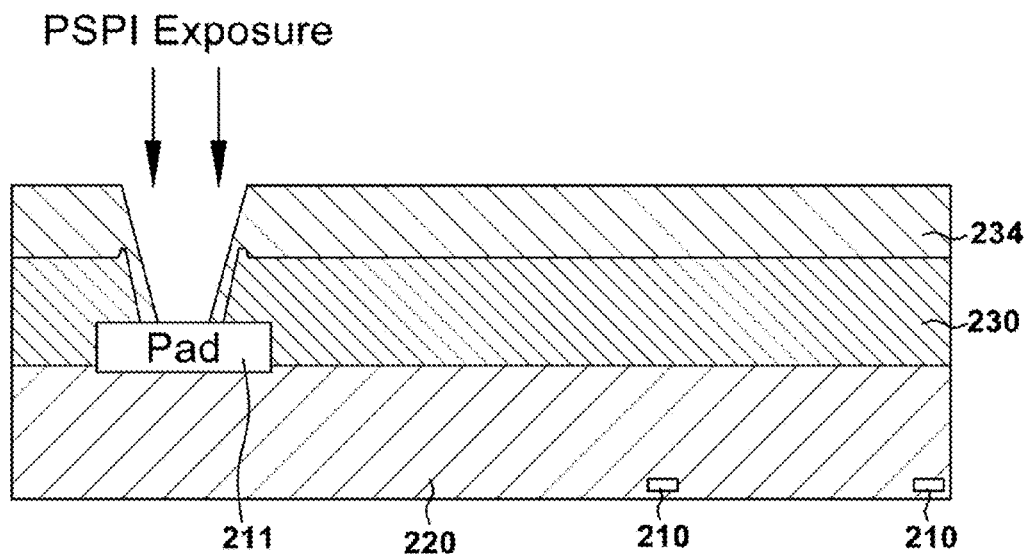
Figure 3F:
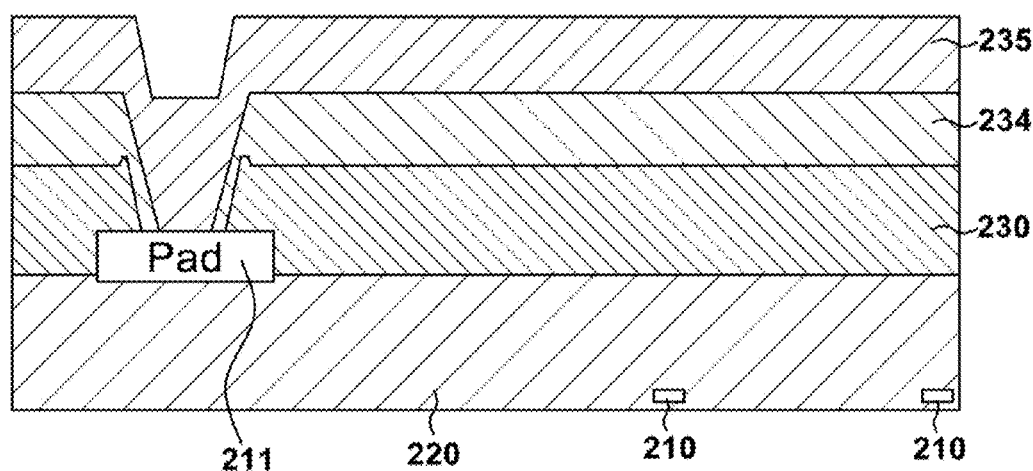
Figure 3G:
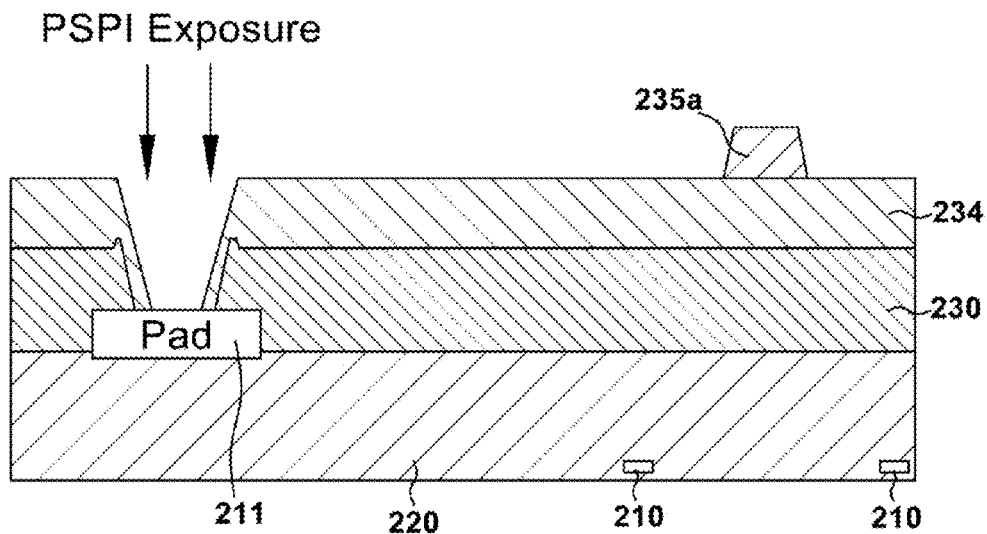
Figure 3H:
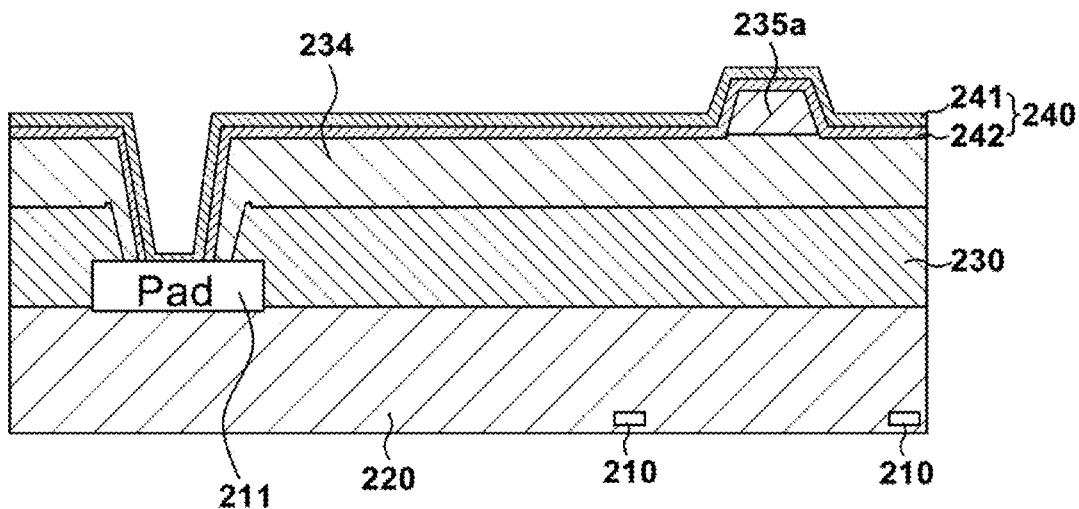
Figure 3I:
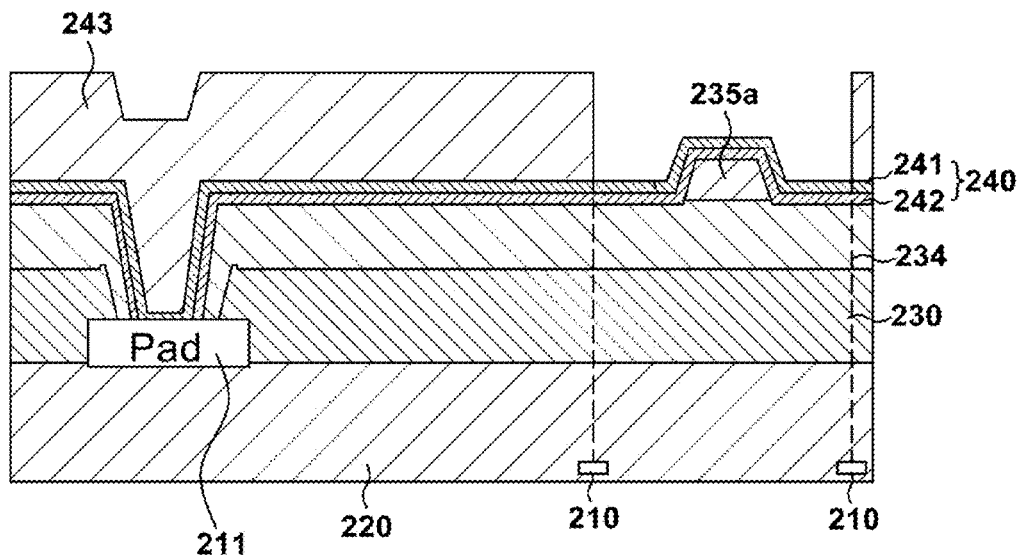
Figure 3J:
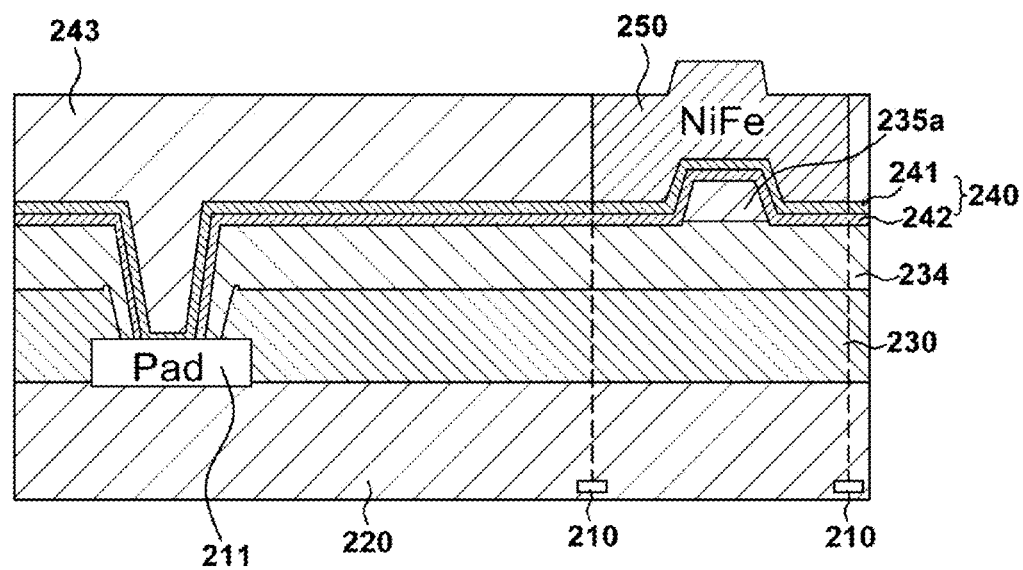
Figure 3K:
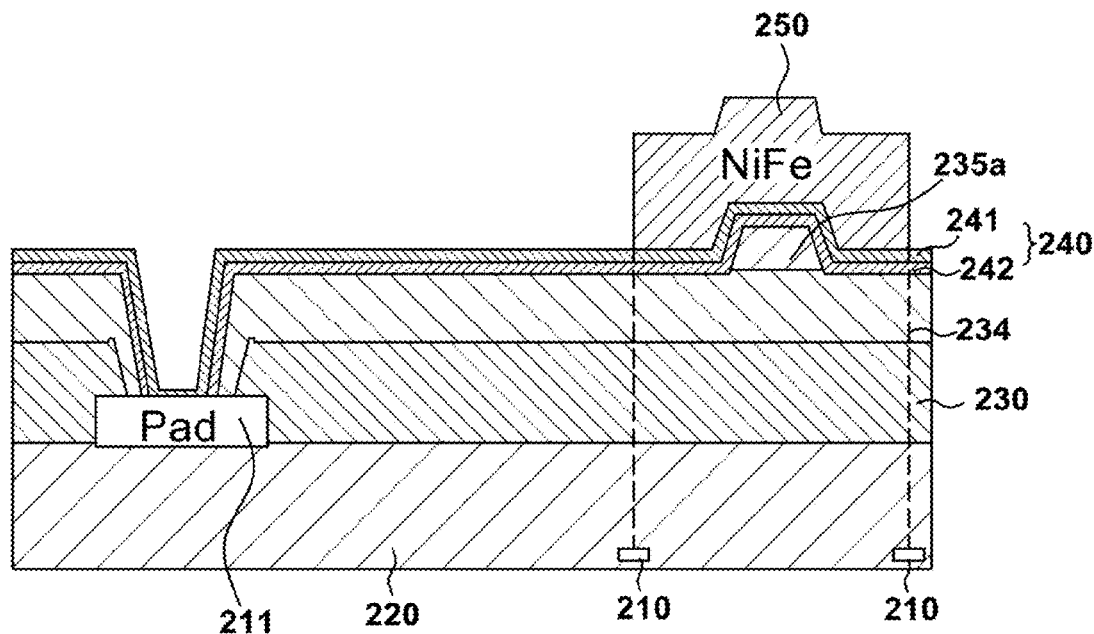
Figure 3L:
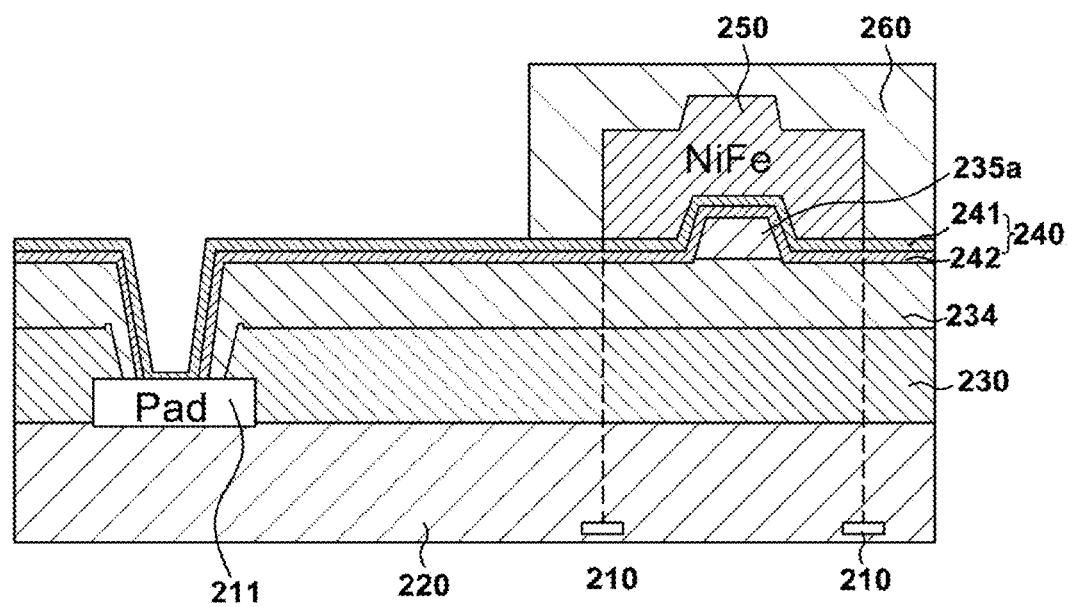
Figure 3M:
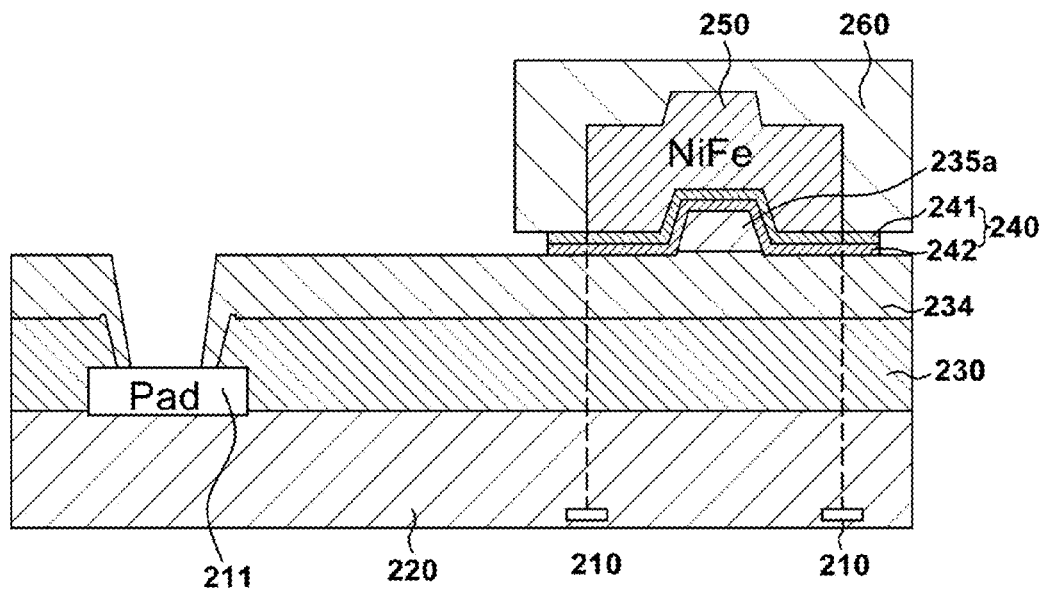
Figure 3N:
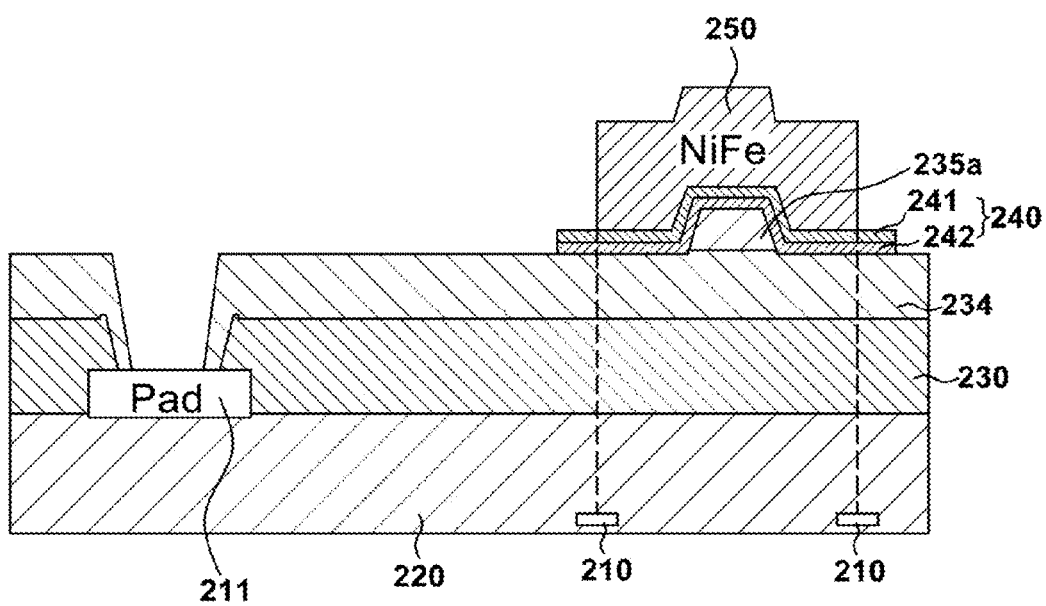
Figure 3O:
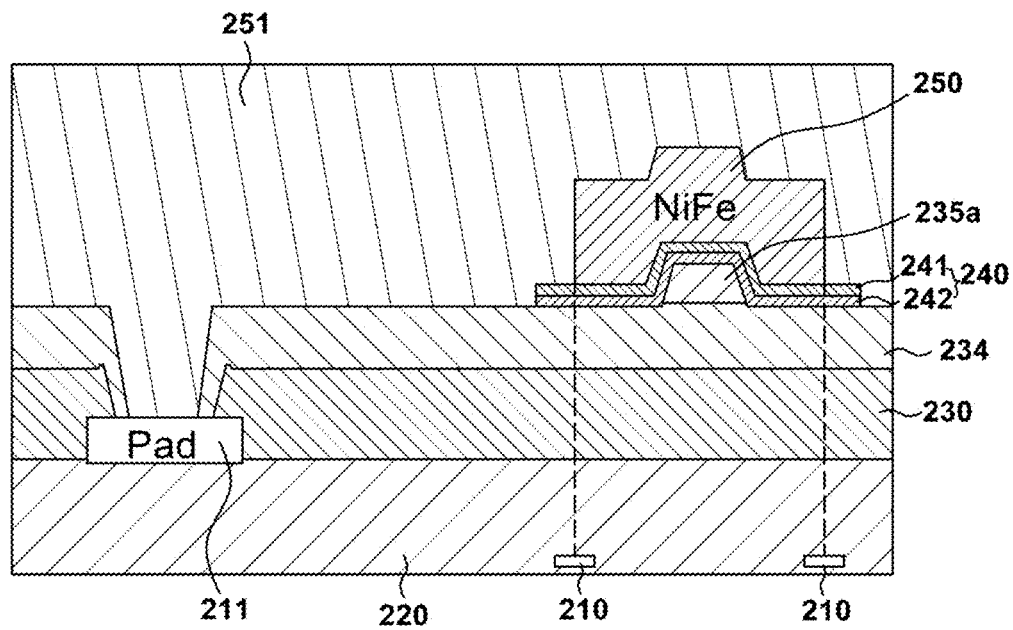
Figure 3P:
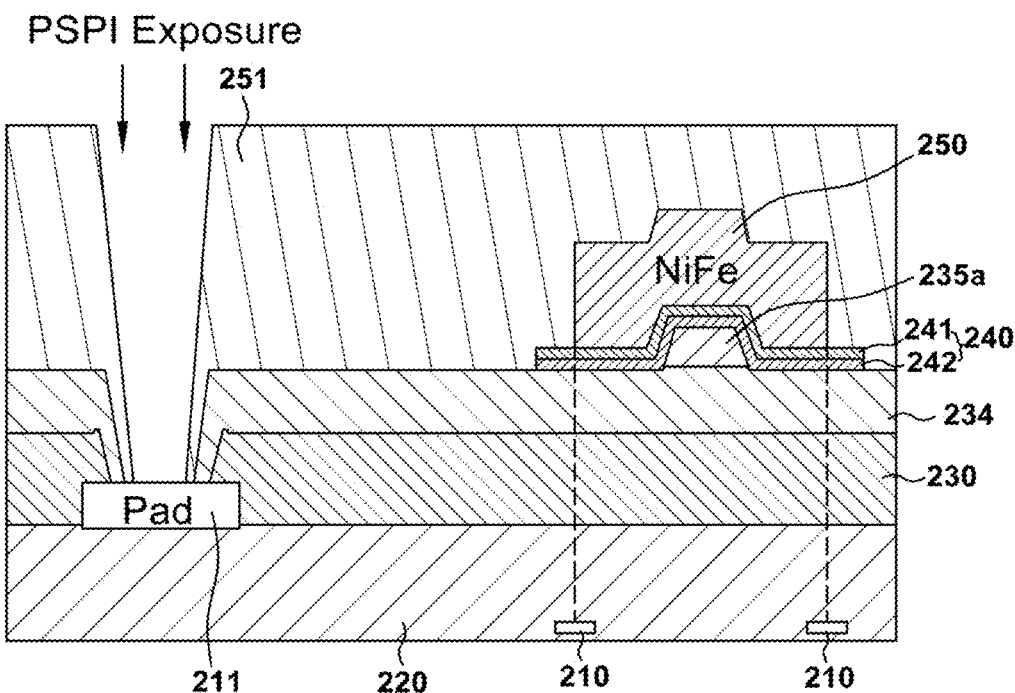

FIGS. 3A to 3P are cross-sectional views that explain an example of a method for manufacturing a magnetic sensor that may function as a digital compass.

The method for manufacturing a magnetic sensor may include the steps of forming a semiconductor substrate 220 with a plurality of Hall elements 210 formed therein, forming a protective layer 230 on the substrate 220, forming a first buffer elevation layer 234 on the protective layer 230, forming a plurality of second buffer elevations 235a with a predetermined height on the surface of the first buffer elevation layer 234, forming a base layer 240 having bent surfaces corresponding to the plurality of second buffer elevations 235a, and forming an integrated magnetic concentrator 250 having a bent surface on the base layer 240. In a plan view of the device, the area of the base layer 240 may be larger than the area of the IMC 250.

In order to form the IMC 250, as illustrated in FIG. 3M, a photoresist 260 that is larger than the IMC 250 in a plan view may be formed to cover an upper portion of the IMC 250 by photo processing. After covering the IMC 250 with the photoresist 260, the base layer 240 may be eliminated from the remaining area of the protective layer 230 via wet etching, thus leaving behind a protruding portion 240a of the base layer 240 that extends from an edge of the IMC 250 by a predetermined distance B along the outer circumference of the IMC 250.

The length B of the protruding portion 240a may be 10-50 μm. A plurality of elevated portions is formed on the base layer 240 and the IMC 250 according to the shape of the second buffer elevations 235a. Further, the second buffer elevations 235a may include polyimide, and the elevated portions of the base layer 240 and the IMC 250 may have a regular pattern or an irregular pattern of a plurality of concaves and convexes (凹凸) in its cross section. A plurality of Hall elements 210 may be arranged so as to overlap a predetermined area thereof with the edge of the IMC 250, and the base layer 240 may be formed from a material including titanium (Ti) or titanium-tungsten (TiW) deposited into a layer, and a copper metal (Cu) layer stacked thereon.

An example of a method of manufacturing a magnetic sensor will be explained in a greater detail below with reference to FIGS. 3A to 3P.

First, referring to FIG. 3A, a plurality of Hall elements 210 are formed in a substrate 220. The plurality of Hall elements 210 may be buried in the substrate 220 or formed on the surface of the substrate 220 at predetermined intervals from each other. The substrate 220 may include a complementary metal-oxide semiconductor (CMOS).

The Hall elements 210 include an N-type region and a P-type region, each formed by implanting N-type or P-type ions. In this example, the P-type region is formed on a predetermined portion of the surface of the semiconductor substrate, while the N-type region is formed deeper than the P-type region. The Hall elements 210 constructed as explained above are capable of detecting changes in magnetic force that is amplified by the magnetic material.

Further, a pad 211 may be formed on a surface of the substrate 220 and the protective layer 230 may be formed thereon. The protective layer 230 may consist of a silicon oxide layer or a nitride layer.

Further, several additional processing may be performed, including, for example, the deposition of an insulating layer and the installation of a metal wiring on the substrate 220 between the Hall elements 21 and the pad 211.

After that, referring to FIG. 3B, an etching is performed on the protective layer 230 with a pad photoresist pattern 232 with an open upper portion corresponding to the location of the pad 211. The pad photoresist pattern 232 may be a pattern that is designed to expose the pad 211 via etching.

As the protective layer 230 on the upper portion of the pad 121 is etched, the upper portion of the pad 211 is exposed as illustrated. Accordingly, the Hall elements 210 can be electrically connected to other external components via the pad 211 through the exposed upper portion.

Referring to FIG. 3C, the pad photoresist pattern 232 remaining on the upper portion of the protective layer 230 may be completely eliminated by ashing. For example, a plasma ashing process may be used to remove the pad photoresist pattern 232.

Next, referring to FIG. 3D, the upper portion of the protective layer 230 is coated with a photo sensitive polyimide (PSPI) coating, which forms a first buffer elevation layer 234 on the pad 211 and the protective layer 230. The first buffer elevation layer 234 may be formed of polyimide. With the PSPI coating, the upper portion of the protective layer 230 and the pad 211 are covered by the first buffer elevation layer 234.

Referring to FIG. 3E, a PSPI exposure process is performed with a first buffer mask (not illustrated) disposed on the first buffer elevation layer 234. The PSPI exposure process provides an easy method of removing the first buffer elevation layer 234 from the upper portion of the pad 211 and re-opening the upper portion of the pad 211.

After that, a curing process is performed to solidify the first buffer elevation layer 234. The solidified first buffer elevation layer 234 has the same property as a thermal oxide layer, and is resistant to removal during subsequent processes that involve further light exposure and etching.

Referring to FIG. 3F, the solidified first buffer elevation layer 234 is coated with a second PSPI coating. The second PSPI coating results in a pre-buffer elevation layer 235 above the solidified first buffer elevation layer 234 and the exposed upper portion of the pad 211.

The pre-buffer elevation layer 235 may be formed of polyimide like the first buffer elevation layer 234. In this process, the upper portion of the pad 211 is covered by the pre-buffer elevation layer 235.

Referring to FIG. 3G, a PSPI exposure process is performed using a second buffer mask (not illustrated) on the pre-buffer elevation layer 235 to remove the second buffer elevation layer 235 from the upper surface of the first buffer elevation layer 234, except in the regions that a second buffer elevation 235a is to be formed with a predetermined height. The upper portion of the pad 211 may be re-opened while the second buffer elevation 235a is formed. The second buffer elevation 235a is solidified by curing. The solidified second buffer elevation 235a causes the generation of uneven, bent surfaces on the base layer 240 and the IMC 250 that are formed in the subsequent processes.

Although FIG. 3G depicts an example in which one second buffer elevation 235a is formed, in other examples, two or more second buffer elevations 235a with a predetermined height may be formed. In this example, only one buffer elevation 235a is illustrated for conciseness.

The second buffer elevation 235a is required in addition to the first buffer elevation layer 234 to form the elevated portion on a surface of the IMC 250. The second buffer elevation 235a may have a tapered positive slope along its sides in its crosssection, or have a shape with a narrower upper portion and a broader lower portion, to facilitate formation of the IMC 250 and the base layer 240 in subsequent processes.

When a physical vapor deposition (PVD) process or a sputtering process is used to form the base layer 20, the base layer 240 can be formed to have an even deposition thickness that covers the second buffer elevation 235a if the second buffer elevation 235a has a positive slope. For example, in the subsequent process, the base layer 240 may be formed by depositing TiW and Cu in a physical vapor deposition (PVD) process or a sputtering process. The TiW layer and the Cu layer that results from the PVD process may have an even thickness over the second buffer elevation 235a if the second buffer elevation 235a has a positive slope on it sides.

On the contrary, the second buffer elevation 235a with a predetermined height that has a negative slope may cause the deposition thickness of the base layer 240 to be irregular or uneven. Accordingly, in this example, the second buffer elevation 235a is formed with sides having a positive slope.

Referring to FIG. 3H, the base layer 240 is formed on the first buffer elevation layer 234 with the second buffer elevation 235a formed thereon, for the purpose of facilitating the electroplating that is to be subsequently performed. For example, the base layer 240 may be formed by consecutively depositing a TiW layer 242 and a Cu layer 241 in a sputtering process or in a vacuum evaporation coating process. Accordingly, the TiW layer 242 and the Cu layer 241 may be formed in sequence.

In this example, the total thickness of the TiW layer 242 and the Cu layer 241 may be 200~800 nm. The role of the base layer 240 is to facilitate the electroplating of the electric material in the subsequent process. As mentioned above, because the base layer 240 is formed on the second buffer elevation 235a, the base layer 240 has an elevated portion and a bent in its cross-section.

Referring to FIG. 3I, in order to form the IMC 250, a pattern mask 243 for the IMC 250 is first prepared by photolithography and arranged on the base layer 240. Then, referring to FIG. 3J, NiFe is electroplated on the pattern mask 243, and the IMC 250 is deposited on the upper portion of the base layer 240.

When the electroplating is completed, referring to FIG. 3K, the pattern mask 243 is removed by photoresist stripping, thus leaving the IMC 250 on a predetermined area of the base layer 240.

According to this example, the IMC 250 may be made of a magnetic material. For example, an alloy of nickel and iron may be used to form the IMC 250.

After that, referring to FIG. 3L, a photoresist 260 is formed so as to cover the upper portion of the IMC 250 and to cover an area of the base layer 240 outside the IMC 250 by a photo process. The photoresist may be used configured the base layer 240 to have a larger surface area than the IMC 250.

Referring to FIG. 3M, when the base layer 240 consisting of the Cu layer 241 and TiW layer 242 is removed by wet etching with the photoresist 260 covering a portion of the base layer 240, a portion of the base layer 240 that extends from the IMC 250 is not etched. Thus, referring to FIG. 3N, the base layer 240 is formed to have a larger area than the IMC 250.

At this time, as the IMC 250 and the base layer 240 are formed on the solidified, second buffer elevation 235a of a predetermined height, the IMC 250 and the base layer 240 have a bent surface, and such bent shape of the IMC 250 attenuates stress and thus reduces offset voltage. After that, referring to FIG. 3O, a third buffer elevation layer 251 may be additionally formed on the base layer 250 and the IMC 250 by PSPI coating. The third buffer elevation layer 251 may be made of polyimide like the first buffer elevation layer 234 and the second buffer elevation 235a.

Referring to FIG. 3P, the upper portion of the pad 211 is re-opened by a PSPI exposure using a third buffer mask (not illustrated) on the third buffer elevation layer 251. The third buffer elevation layer 251 is then cured to solidify the third buffer elevation layer 251.

Accordingly, a magnetic sensor can be efficiently manufactured according to this example, using semiconductor manufacturing processes.

Figure 4:
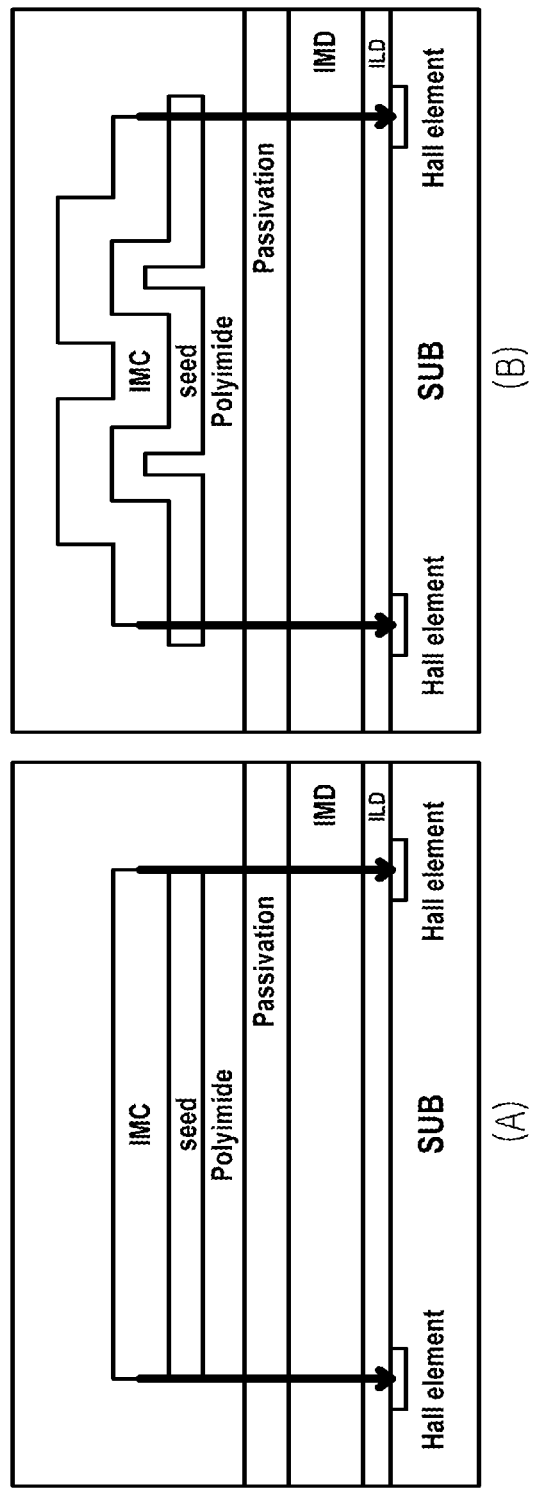
FIG. 4 illustrates a cross-sectional view of a flat-shaped magnetic sensor in (A) and a cross-sectional view of an example of a magnetic sensor according to the present disclosure in (B).
Figure 5A:
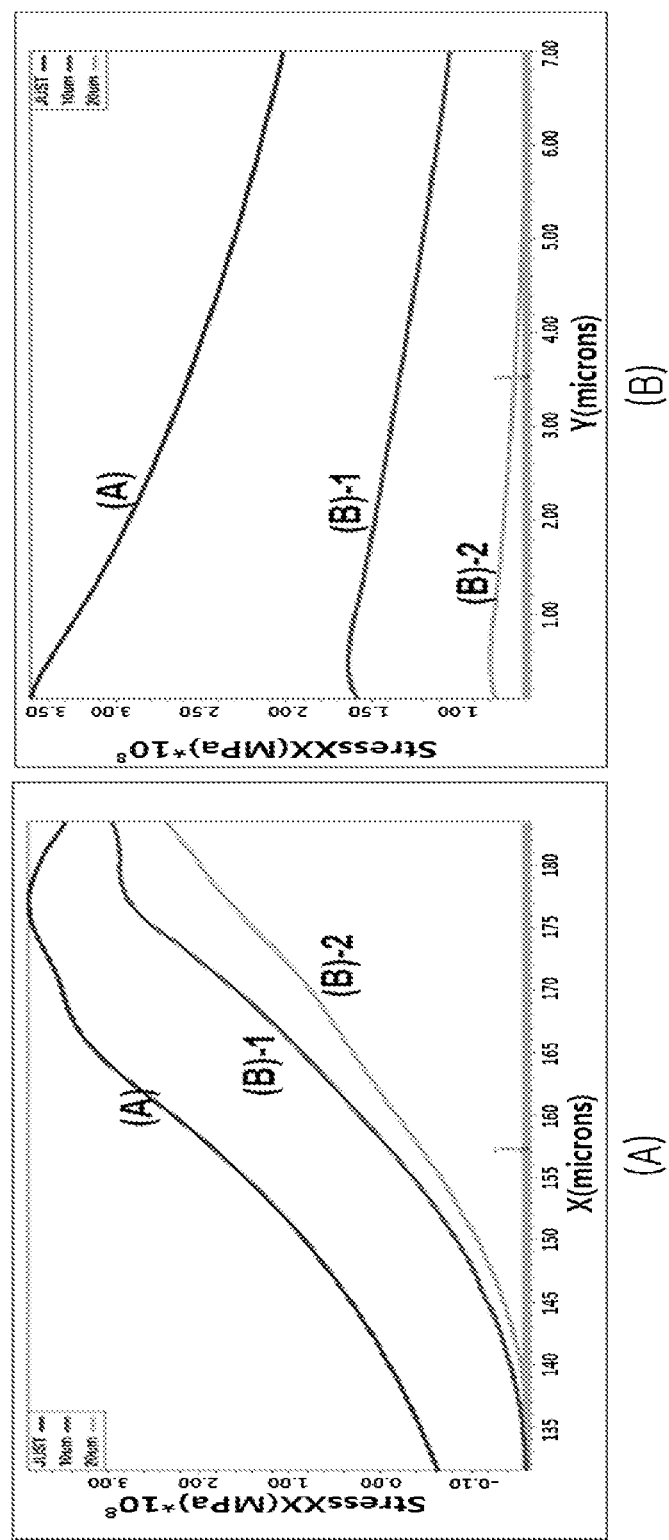
FIG. 5A includes graphs illustrating stress exerted on Hall elements in the magnetic sensors illustrated in FIG. 4 in an X-axis direction.
Figure 5B:
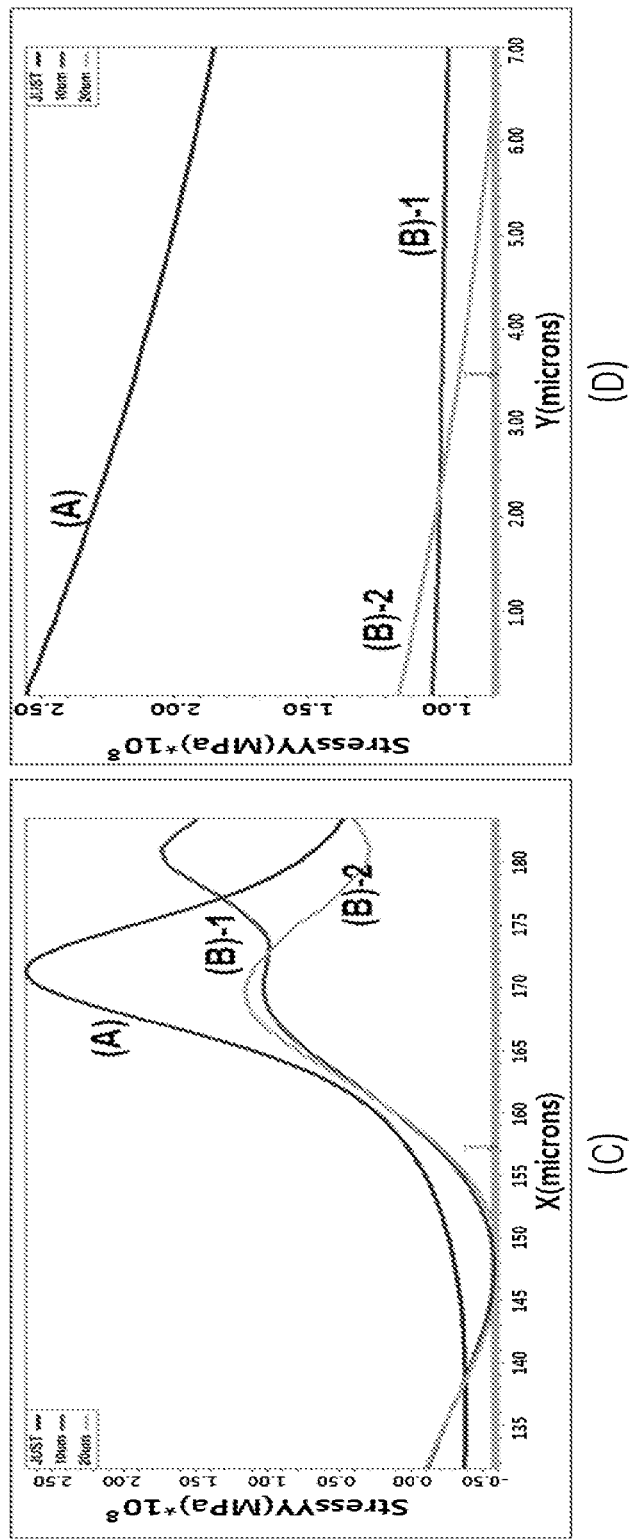
FIG. 5B includes graphs illustrating stress exerted on Hall elements in the magnetic sensors illustrated in FIG. 4 in a Y-axis direction.

FIG. 4 includes a cross-sectional view of a flat-shaped magnetic sensor in (A) and a cross-sectional view of an example of a magnetic sensor according to the present disclosure in (B). FIG. 5A is a graph illustrating the stress in an X-axis direction that is exerted on Hall elements of the magnetic sensors illustrated in FIG. 4. FIG. 5B is a graph illustrating stress in a Y-axis direction that is exerted on Hall elements of the magnetic sensors illustrated in FIG. 4.

As explained above, the Hall elements 210 used for sensing magnetic field are located under the IMC 250. It is desirable to minimize the stress at this region in order to maintain various magnetic sensor characteristics.

The thick edge of the IMC 250 is a portion that is subject to the highest level of stress, and the influence of the stress on the Hall elements 210 is confirmed via a simulation. The simulation results are shown in FIGS. 5A and 5B.

FIG. 5A illustrates stress along an X-axis of the IMC 250 according to depths from the surface of the Hall elements 210 (A, B), and FIG. 5B illustrates stress along an Y-axis of the IMC 250 (C, D). The 'stress' as used herein refers to pressure, tensile stress and/or compressive stress exerted on the Hall elements.

Compared to a magnetic sensor having a flat shape as illustrated in (A) of FIG. 4, in a magnetic sensor of the present disclosure that has a base layer 240 with a protrusion length of 10 μm and 20 μm in radius, which are illustrated as (B-1) and (B-2), respectively, exhibited lower stress in both X-axis and Y-axis directions.

The stress improvement also improves the offset characteristic of the Hall elements 210, and increases the sensitivity of the magnetic sensor.

Figure 6:
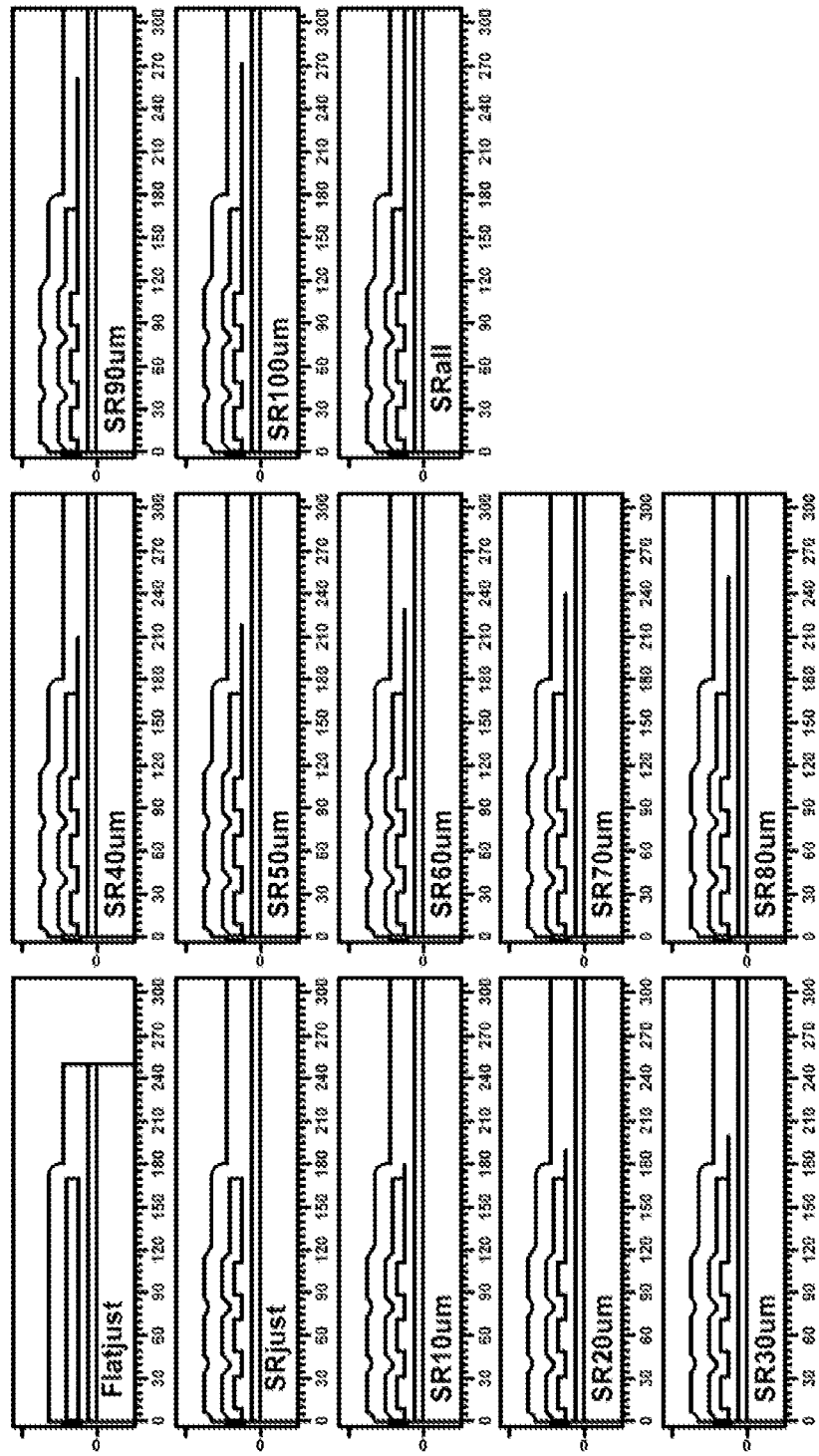
FIG. 6 illustrates cross-sectional views of various examples of magnetic sensors with bases layers having different protrusion lengths.
Figure 7A:
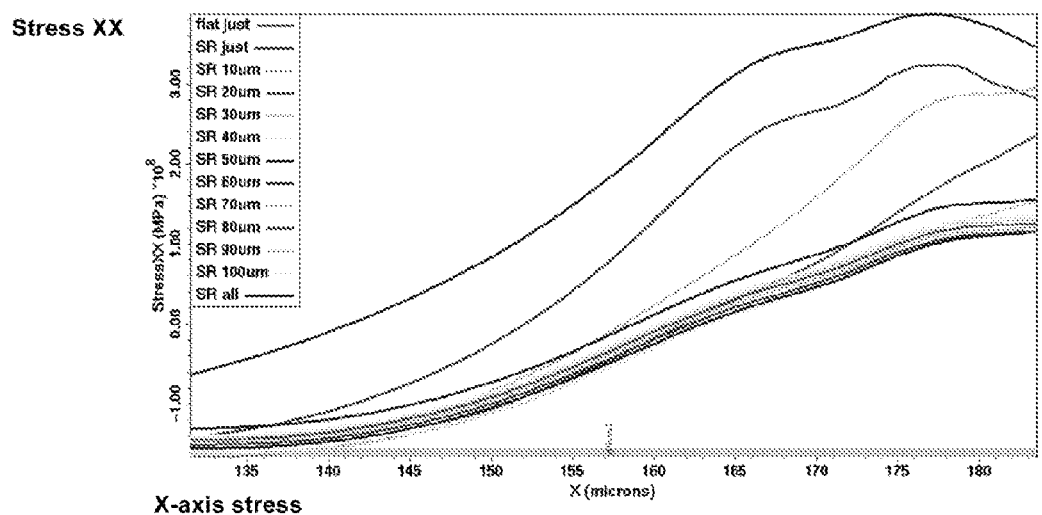
FIG. 7 is a graph illustrating stress in a X-axis direction and stress in a Y-axis direction exerted on Hall elements of the magnetic sensors of FIG. 6.
Figure 7B:
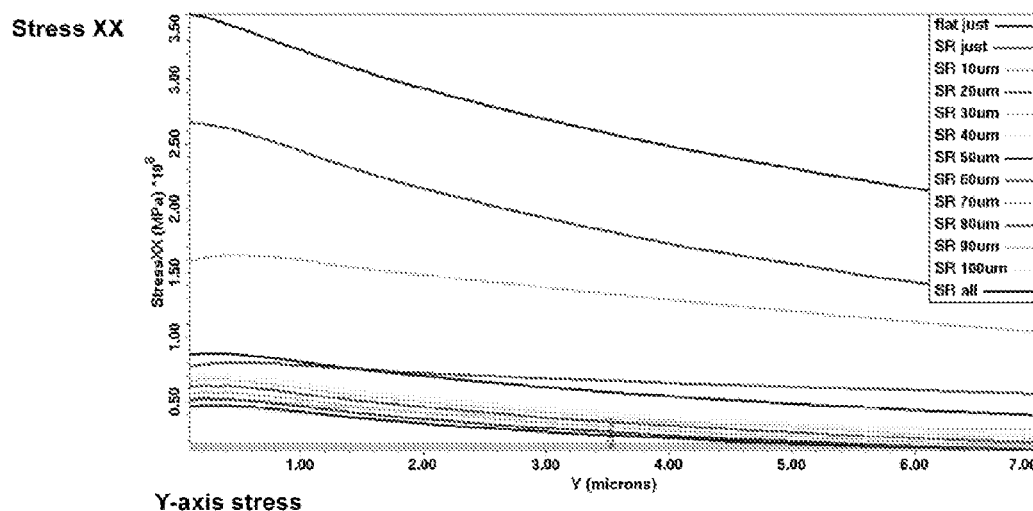
Figure 7C:
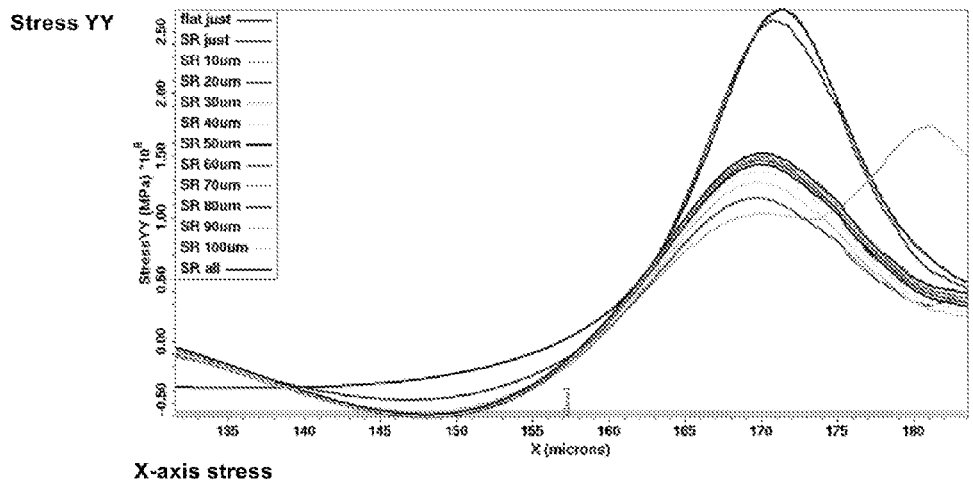
Figure 7D:
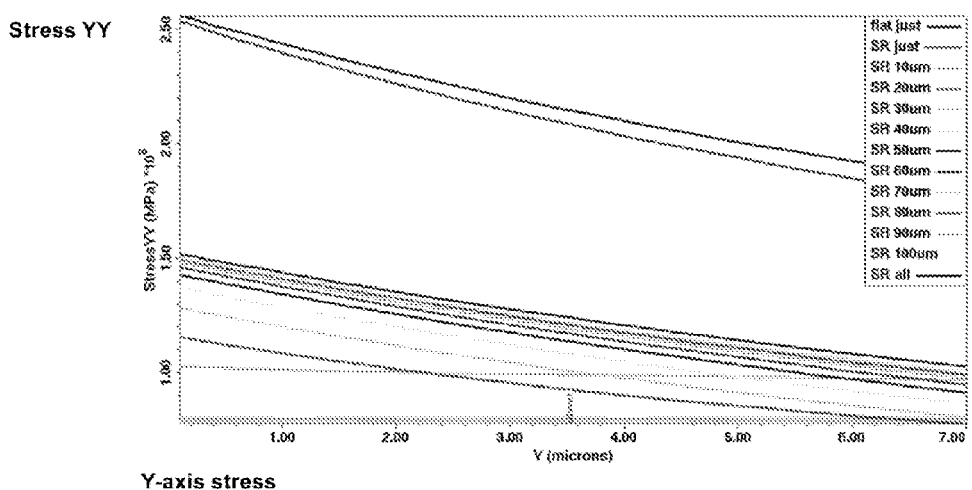
Figure 8:
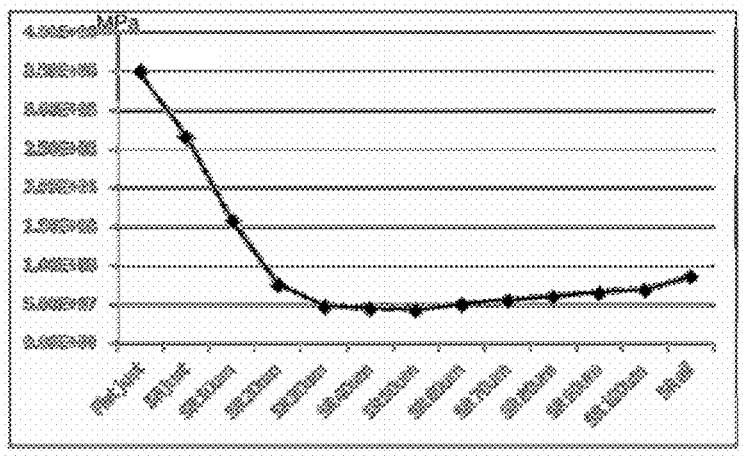
FIG. 8 is a graph illustrating stress in the X-axis direction of various examples of magnetic sensors illustrated in FIG. 7.
Figure 9:
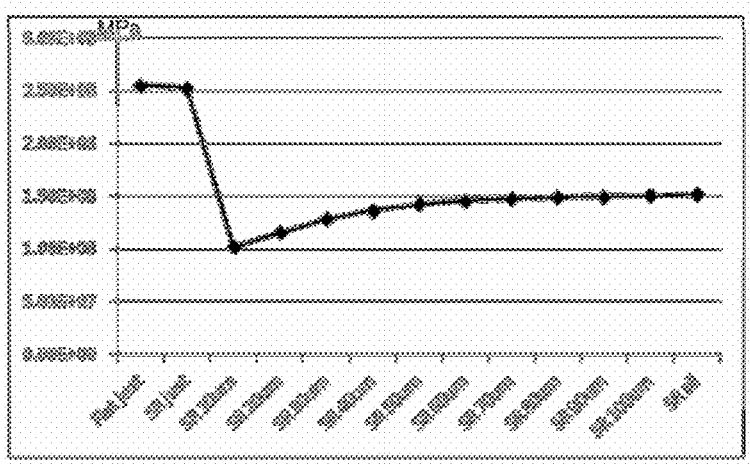
FIG. 9 is a graph illustrating stress in the Y-axis direction of various examples of magnetic sensors illustrated in FIG. 7.

FIG. 6 is a diagram that compares the cross-sectional views of various examples of magnetic sensors with different base layer protrusion lengths. FIG. 7 includes graphs illustrating stress in an X-axis direction and a Y-axis direction that is exerted on Hall elements of the magnetic sensors illustrated in FIG. 6. FIG. 8 includes graphs that illustrate changes in the stress in the X-axis direction according to various protrusion lengths of the base layers. FIG. 9 illustrates a graph illustrating changes in the stress in the Y-axis direction according to various protrusion lengths of the base layers.

As illustrated, in one example of a magnetic sensor, the area of the base layer 240 is larger than that of the IMC 250 having a bent surface. Referring to FIG. 6, the length of the protruding portion 240a on the edge of the base layer 240 was set to be the same as the length of the IMC 250 in one example (Flat just). The length of the IMC 250 is indicated as SR. In other examples, the length of the protruding portion 240a that extends beyond the edge of the IMC 250 was set to 10 μm (SR 10 um), 20 μm (SR 20 um), 30 μm (SR 30 um), 40 μm (SR 40 um), 50 μm (SR 50 um), 60 μm (SR 60 um), 70 μm (SR 70 um), 80 μm (SR 80 um), 90 μm (SR 90 um), 100 μm (SR 100 um). In another example, the length of the protruding portion 240a was set to the same length as the substrate 220 (SR all). For each of the examples, the changes in the stress along the X and Y axes were simulated, and the results are shown in FIGS. 7 to 9.

Referring to FIGS. 7 and 8, on comparing X-axis stress on the surface of the Hall sensor, as the length of the protruding portion 240a on the base layer 240 increases, the stress decreased. The stress was the lowest when the length of the protruding portion 240a was 40~50 μm. The increase of the length of the protruding portion 240a beyond 60 μm appears to give arise to the generation of new stress due to the addition of protrusions to the base layer.

Further, referring to FIGS. 7 and 9, on comparing the stress in Y axis on the surface of the Hall sensor, the stress decreased as the length of the protruding portion 240a of the base layer 240 increased. The stress was the lowest when the length of the protruding portion 240a was in a range of 10 to 20 μm. The offset voltage by the protruding portion against the stress from the IMC is considered to have been decreased when the length was 10 μm or less, or 20 μm or above.

Considering the X and Y axes stresses as explained above, the length of the protruding portion may be set to a range of 10 to 50 μm.

Various examples of magnetic sensors and methods of fabricating the same are described above. According to an example, a technical object is to provide a semiconductor-based magnetic sensor having reduced stress to Hall elements and consequently improved magnetic sensor characteristics, as an area of a base layer is set to be larger than an area of an integrated magnetic concentrator (IMC) in a plan view.

In an example, a semiconductor-based magnetic sensor may include a semiconductor substrate comprising a plurality of Hall elements arranged therein, a protective layer formed on the semiconductor substrate, a base layer formed on the protective layer, and an integrated magnetic concentrator (IMC) formed on the base layer and comprising a bent surface on a surface thereof. The base layer may have a larger cross-sectional area than that of the IMC.

The semiconductor-based magnetic sensor may include a protruding portion extending from an edge of the base layer to a predetermined length exceeding an outer circumference of the IMC.

The protruding portion may be 10-50 μm in length. The semiconductor-based magnetic sensor may include a first buffer elevation layer and a plurality of second buffer elevation layers of a predetermined height on the surface of the protective layer, in which the base layer and the IMC may have a plurality of bent surfaces according to a configuration of the second buffer elevations of the predetermined height.

The second buffer elevation layers of the predetermined height may include polyimide. The bent surfaces of the IMC may include a regular or irregular pattern of a plurality of concaves and convexes (凹凸) in cross section.

The plurality of Hall elements may be so arranged as to overlap a predetermined area with an end of the IMC. The base layer may be made from a material having a titanium or titanium-tungsten layer deposited, and a copper metal stacked thereon.

In another example, a digital compass is provided, which may be made using the above semiconductor-based magnetic sensor.

In another example, a method for manufacturing a semiconductor-based magnetic sensor includes forming a semiconductor substrate comprising a plurality of Hall elements arranged therein, forming a protective layer on the semiconductor substrate, forming a first buffer elevation layer on the protective layer, forming a plurality of second buffer elevation layers of a predetermined height on a surface of the first buffer elevation layer, forming a base layer having a bent surface corresponding to the plurality of second buffer elevation layers of the predetermined height, and forming an integrated magnetic concentrator (IMC) comprising a bent surface on the base layer, wherein the base layer has a larger cross-sectional area than that of the IMC.

The method may include forming a protruding portion on an edge of the base layer to a predetermined length exceeding an outer circumference of the IMC, by forming a larger photoresist (PR) than the IMC on an upper portion of the IMC by photo processing and eliminating the base layer by wet etching.

The protruding portion may be 10-50 μm in length. The base layer and the IMC may include a plurality of bent surfaces according to a configuration of the second buffer elevations of the predetermined height.

The second buffer elevation layers of the predetermined height may include polyimide. The bent surfaces of the base layer and the IMC may include a regular or irregular pattern of a plurality of concaves and convexes (凹凸) in cross section.

The plurality of Hall elements may be so arranged as to overlap a predetermined area with an end of the IMC. The base layer may be made from a material having a titanium or titanium-tungsten layer deposited, and a copper metal stacked thereon.

In yet another example, a semiconductor-based magnetic sensor is provided, which may include a semiconductor substrate comprising a plurality of Hall elements arranged therein, a protective layer formed on the semiconductor substrate, a base layer formed on the protective layer, and an integrated magnetic concentrator (IMC) formed on the base layer and comprising a bent surface on a surface thereof. The base layer may be further protruded than an end of the Hall elements.

The Hall elements may include an N-type ion implanted region and a P-type ion implanted region on the substrate.

The N-type ion implanted region may be formed deeper than the P-type ion implanted region.

The Hall elements may be so arranged as to overlap a predetermined area with an end of the IMC.

According to various examples, the semiconductor-based magnetic sensor and a manufacturing method thereof may reduce stress to Hall elements and consequently improved magnetic sensor characteristics, as the IMC with bent configuration is provided.

The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for manufacturing a magnetic sensor, the method comprising:
    obtaining a substrate comprising a plurality of Hall elements;
    forming a protective layer on the substrate;
    forming a first buffer layer on the protective layer;
    forming a second buffer layer on the first elevation layer;
    forming a base layer comprising a surface with an elevated portion corresponding to the second buffer layer; and
    forming an integrated magnetic concentrator (IMC) comprising a surface with an elevated portion on the base layer,
    wherein the base layer has a larger area than the IMC.

2. The method of claim 1, wherein the plurality of Hall elements overlaps with an edge of the IMC.

3. The method of claim 1, wherein the base layer comprises a titanium layer or a titanium-tungsten layer, and a copper layer.

4. The method of claim 1, wherein the forming of the base layer comprises forming a protruding portion that extends from an outer circumference of the IMC to an edge of the base layer by a predetermined length, using a photoresist to cover the IMC and performing wet etching.

5. The method of claim 4, wherein the predetermined length of the protruding portion is 10 μm or greater and 50 μm or less.

6. The method of claim 1, wherein the elevated portion of the IMC has a shape corresponding to the second buffer layer.

7. The method of claim 6, wherein the second buffer layer comprises polyimide.

8. The method of claim 1, wherein the elevated portion of the IMC comprises a plurality of concaves and convexes (凹凸) in cross section.

9. A magnetic sensor comprising:
a substrate comprising a plurality of Hall elements;
a protective layer formed on the substrate;
a base layer formed on the protective layer; and
an integrated magnetic concentrator (IMC) formed on the base layer and comprising a surface with an elevated portion, the base layer protruding outward from an edge of the IMC.

10. The magnetic sensor of claim 9, wherein the plurality of the Hall elements overlaps with an edge of the IMC in a vertical direction.

11. The magnetic sensor of claim 9, wherein the plurality of Hall elements comprises an N-type region and a P-type region implanted on the substrate.

12. The magnetic sensor of claim 11, wherein the N-type region is formed deeper than the P-type region.

13. A magnetic sensor, comprising:
a substrate comprising a plurality of Hall elements;
a protective layer formed on the substrate;
a base layer formed on the protective layer; and
an integrated magnetic concentrator (IMC) formed on the base layer and comprising a surface with an elevated portion,
wherein the base layer has a larger cross-sectional area than the IMC.

14. The magnetic sensor of claim 13, wherein the elevated portion of the IMC comprises a plurality of concaves and convexes (凹凸) in cross section.

15. The magnetic sensor of claim 13, wherein the plurality of Hall elements overlaps with an edge of the IMC in a vertical direction.

16. The magnetic sensor of claim 13, wherein the base layer comprise a titanium layer or a titanium-tungsten layer, and a copper layer.

17. A digital compass comprising the magnetic sensor of claim 13.

18. The magnetic sensor of claim 13, wherein the base layer comprises a protruding portion that extends from an outer circumference of the IMC to an edge of the base layer by a predetermined length.

19. The magnetic sensor of claim 18, wherein the predetermined length of the protruding portion is 10 μm or greater and 50 μm or less.

20. The magnetic sensor of claim 13, further comprising a first buffer layer disposed on the protective layer, and a second buffer layer disposed on the first buffer layer, wherein the elevated portion of the IMC has a shape that corresponds to the second buffer layer.

21. The magnetic sensor of claim 20, wherein the second buffer layer comprises polyimide.

* * * * *